United States Patent [19]

Lee et al.

[11] Patent Number: 5,593,919
[45] Date of Patent: Jan. 14, 1997

[54] PROCESS FOR FORMING A SEMICONDUCTOR DEVICE INCLUDING CONDUCTIVE MEMBERS

[75] Inventors: Chii-Chang Lee; Hisao Kawasaki, both of Austin, Tex.

[73] Assignee: Motorola Inc., Schaumburg, Ill.

[21] Appl. No.: 523,174

[22] Filed: Sep. 5, 1995

[51] Int. Cl.$^6$ ............................................. H01L 21/3213
[52] U.S. Cl. ........................ 437/190; 437/195; 437/228; 156/636.1; 156/656.1
[58] Field of Search ................................ 437/190, 192, 437/194, 195, 200, 228; 156/636.1, 645.1, 656.1

[56] References Cited

U.S. PATENT DOCUMENTS

| | | | |
|---|---|---|---|
| 4,410,622 | 10/1983 | Dalal et al. ........................... | 430/312 |
| 4,470,874 | 9/1984 | Bartush et al. ........................ | 156/656.1 |
| 4,536,951 | 8/1985 | Rhodes et al. ......................... | 437/195 |
| 4,541,893 | 9/1985 | Knight ................................... | 156/643 |
| 4,614,021 | 9/1986 | Hulseweh ............................... | 156/643.1 |
| 4,670,091 | 6/1987 | Thomas et al. ........................ | 156/656.1 |
| 4,914,056 | 4/1990 | Okumura ............................... | 437/192 |
| 4,917,759 | 4/1990 | Fisher et al. ........................... | 156/643 |
| 4,948,459 | 8/1990 | Van Laarhoven et al. ............ | 437/192 |
| 4,954,423 | 9/1990 | McMann et al. ....................... | 437/192 |
| 4,973,562 | 11/1990 | Den Blanken ......................... | 437/192 |
| 5,055,426 | 10/1991 | Manning ................................ | 437/195 |
| 5,071,518 | 12/1991 | Pan ........................................ | 205/122 |
| 5,132,775 | 7/1992 | Brighton et al. . | |
| 5,171,713 | 12/1992 | Matthews .............................. | 437/189 |
| 5,187,121 | 2/1993 | Cote et al. ............................. | 437/195 |
| 5,328,553 | 7/1994 | Poon ..................................... | 437/195 |
| 5,382,545 | 1/1995 | Hong .................................... | 437/195 |
| 5,385,867 | 1/1995 | Ueda et al. ............................ | 437/194 |

FOREIGN PATENT DOCUMENTS

| | | | |
|---|---|---|---|
| 57-64913 | 4/1982 | Japan .................................. | 156/656.1 |
| 59-67649 | 4/1984 | Japan .................................. | 437/195 |
| 5-102314 | 4/1993 | Japan .................................. | 437/195 |
| 6-37190 | 2/1994 | Japan .................................. | 437/195 |
| 2189935 | 11/1987 | United Kingdom .................. | 437/195 |

OTHER PUBLICATIONS

J. R. Kitcher, IBM Tech. Discl. Bulletin, 23 (4) (1980) 1395, "Intergral stud for multilevel metal" Sep. 1980.

Oakley, et al.; "Pillars—The Way to Two Micron Pitch Multilevel Metallisation;" Jun. 21–22, 1984 V–MIC Conf.; Ch. 1999–2; pp. 23–29; (1984).

*Primary Examiner*—Charles L. Bowers, Jr.
*Assistant Examiner*—Leon Radomsky
*Attorney, Agent, or Firm*—George R. Meyer

[57] ABSTRACT

The embodiments of the present invention allow the formation of interconnect and vias without forming via veils or excessive thinning of vias. Conductive members (52, 54, 56, 58) are formed with a pattern generally corresponding to the shape of interconnects. A lower intermetallic insulating layer (70)is deposited over the substrate (30) and removed over conductive members (52, 54, 56, 58) before forming via portions. Via portions are formed from the conductive members (52, 54, 56, 58). An upper intermetallic insulating layer (134) is formed and planarized to fill locations overlying the interconnect portions of the conductive members (52, 54, 56, 58) near the vias.

21 Claims, 9 Drawing Sheets

PROCESS FOR FORMING A SEMICONDUCTOR DEVICE INCLUDING CONDUCTIVE MEMBERS

FIELD OF THE INVENTION

The present invention relates to interconnects for semiconductor devices, and in particular, to integration of interconnect levels within those devices.

BACKGROUND OF THE INVENTION

Conventional multilevel metal processes typically form a plurality of levels of interconnects that are connected to one another with via structures. Typically, a first metal layer is formed over an underlying insulating layer and then patterned to form the first level interconnects from the first metal layer.

After forming the first level interconnects, an insulating layer is deposited over the first level interconnects and patterned to form via openings. The via openings are typically formed by coating a photoresist layer over the insulating layer and patterning it to form openings where the vias will be located. Next, the insulating layer is dry etched to expose a portion of the first level interconnects. During the via etch processing step, the etchants react with the oxide and the metal of the first level interconnects. Within a via opening, via veils typically form and are believed to include the metal of the first level interconnects, the material of the insulating layer, and the photoresist material. Via veils are extremely difficult to remove without severely damaging the exposed first level interconnects or eroding too much of the insulating or photoresist layers.

Via veils can be avoided by forming a stack of at least one conductive material. The stack is twice etched before depositing an insulating layer over the stack. One of the two etch steps defines portions of the stack where vias to an overlying interconnect level are subsequently formed, and the other step forms the general pattern of the interconnects underlying the via portions. The stack is two or more times as thick as a metal layer used to form interconnects.

An insulating layer is deposited over the etched structure after the two etching steps. The vertical distance between the underlying insulating layer and the top of the via portions is extremely large. In many instances, the height difference is typically 1.5–2.0 microns. Step coverage issues and planarizing are major concerns with the device at this process because of the large height difference. Regarding the surface area of the device, the vias make up only a small portion of the total device area.

After depositing the insulating layer over the first level interconnect, the portion of the insulating layer over the via portions of the first level interconnects is removed. Typically, a polishing or etch back process is used. However, these processes can remove too much of the insulating layer and via portions. The via portions occupy only a small portion of the device area making them a poor polish-stop or etch-stop layer. The parasitic capacitive coupling can be too high between the first level interconnect and a second level interconnect if too much of the via portions and insulating layer are removed. In severe cases, an electrical short could result between first and second level interconnects that are not to be electrically connected.

A need exists to form a reliable interconnect structures that are relatively easy to fabricate without having to develop new or marginal processing steps. The process should not form via veils.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

The embodiments of the present invention allow the formation of interconnects and vias without forming via veils or excessive thinning of the vias. The vias are formed after a lower intermetallic insulating layer has been deposited and planarized over conductive members. The present invention is better understood with the embodiments presented below.

General Process Flow

Figure 1:
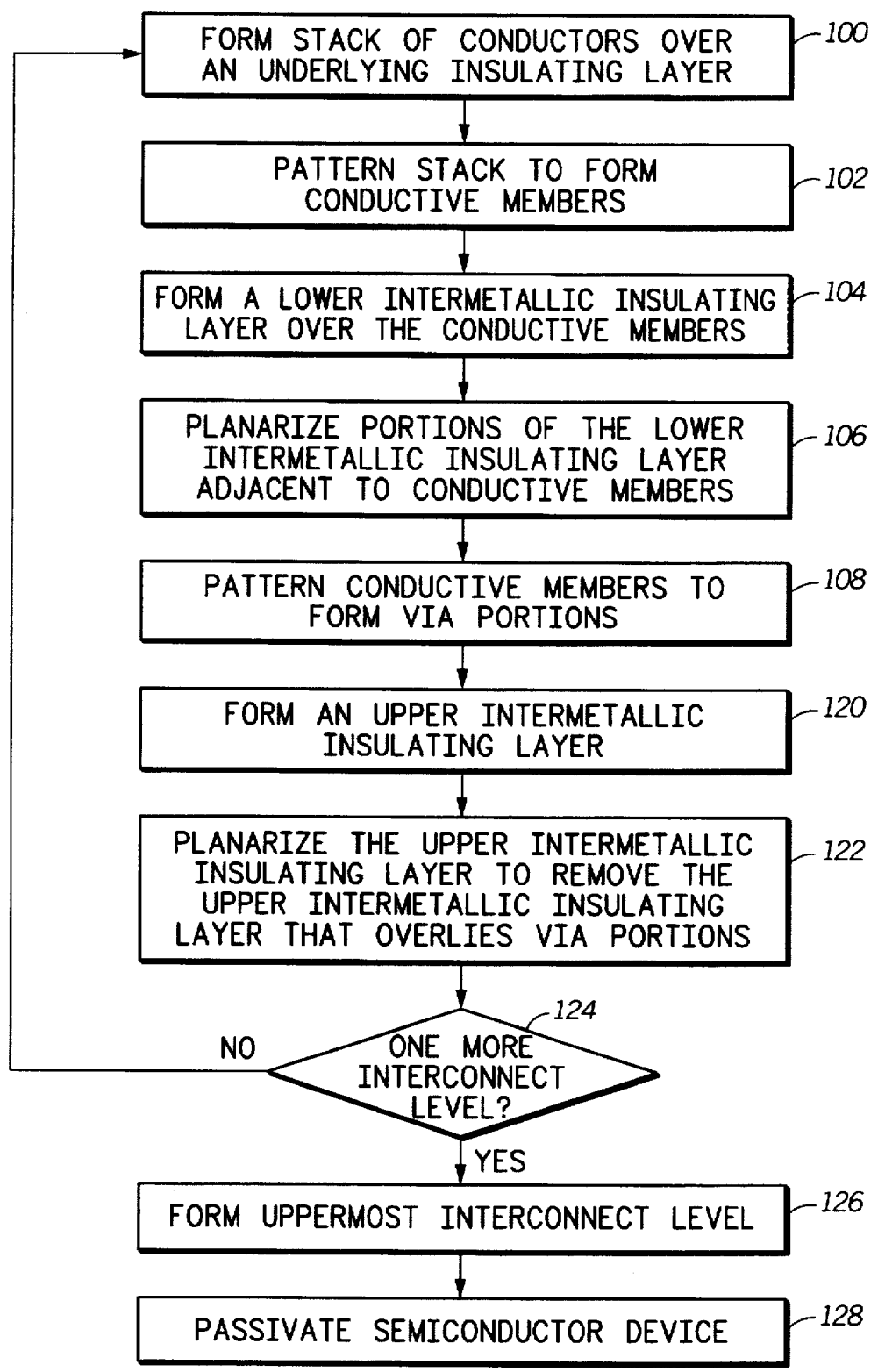
FIG. 1 includes a process flow diagram of an embodiment of the present invention.

FIG. 1 includes a process flow diagram for forming interconnect levels according to an embodiment of the present invention. A stack of conductive layers are formed over an underlying insulating layer (step 100). The stack is patterned to form conductive members (step 102). The shape of the members generally corresponds to the shape of the interconnects. A lower intermetallic insulating layer is formed over the conductive members (step 104). The lower intermetallic insulating layer is partially planarized such that portions of the lower intermetallic insulating layer adjacent to the conductive members are at about the same elevation as the conductive members (step 106). The members are patterned for a second time to form via portions (step 108). An upper intermetallic insulating layer is formed over the via portions (step 120). The upper intermetallic insulating layer is planarized to remove the portion of the upper intermetallic insulating layer that overlies the via portions (step 122). At this point, a decision is made whether only one more interconnect level will be formed (step 124). If not, the process is repeated starting at step 100. If only one more interconnect level is formed, that interconnect level is formed as shown in step 126. After all interconnect levels are formed, the semiconductor device is passivated (step 128).

An Inverter

Figure 2:
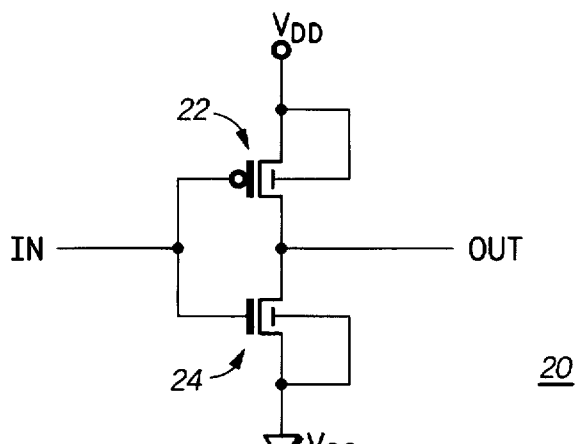
FIG. 2 includes a circuit diagram of an inverter (prior art)

FIG. 2 includes a circuit diagram of an inverter 20 that includes a p-channel transistor 22 and an n-channel transistor 24. The two gates of the transistors are coupled to form an input IN. The two transistors are coupled at their drain regions to form an output OUT. The source of the p-channel transistor 22 is electrically connected to $V_{DD}$, and the source region of the n-channel transistor 24 is electrically connected to $V_{SS}$. FIGS. 3–17 include illustrations during the formation of the inverter 20.

Figure 3:
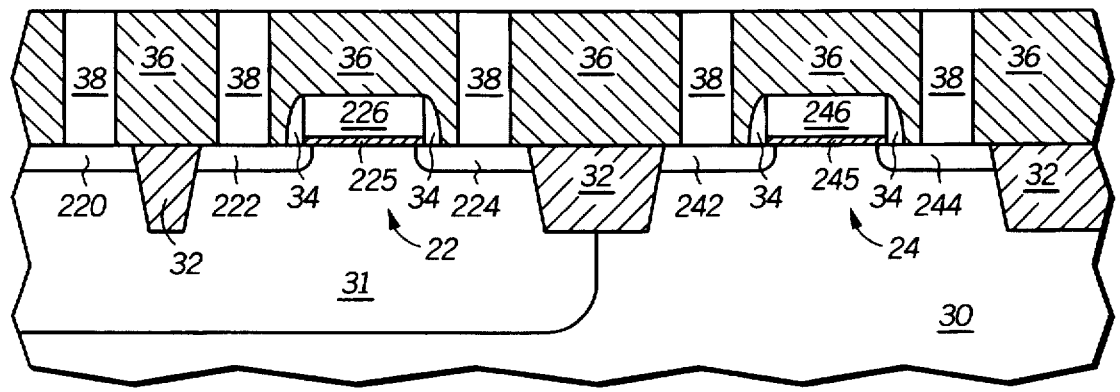
FIG. 3 includes an illustration of a cross-sectional view of a portion of a semiconductor substrate after forming active components within the substrate and plug structures.

FIG. 3 includes an illustration of a cross-sectional view of a portion of a semiconductor substrate 30 after active components including transistors 22 and 24 have been formed. The p-type monocrystalline silicon substrate 30 includes an n-type well region 31. Within the substrate 30 and n-well region 31 are field isolation regions 32 and heavily doped regions 220, 222, 224, 242, and 244. The heavily doped regions have a doping concentration of at least 1E19 atoms per cubic centimeter to allow formation of ohmic contacts. The regions 220, 242, and 244 are n-type doped, and regions 222 and 224 are heavily p-typed doped regions. The p-type substrate 30 typically has a heavily p-type doped region that is electrically connected to $V_{SS}$ but is not shown.

Gate dielectric layers 225 and 245 and gate electrodes 226 and 246 overlie the substrate 30 and n-well region 31. The gate dielectric layers 225 and 245 can be formed from the same layer or different layers. Spacers 34 lie adjacent to the gate dielectric layers 225 and 245 and gate electrodes 226 and 246. A interlevel insulating layer 36 overlies the gate electrodes 226 and 246 and the spacers 34. The interlevel insulating layer 36 includes one or more layers of oxide, nitride or the like. Some or all the layers can be doped. Typically, an undoped portion of the interlevel insulating layer 36 is formed near the primary surface of the substrate 30 and n-well region 31, so that the doped regions 220, 222, 224, 242, and 244 are not counter doped. Contact plugs 38 lie within the opening in the interlevel insulating layer 36. Contact plugs are also made to the gate electrodes 226 and 246 but are not seen in FIG. 3.

Figure 4:
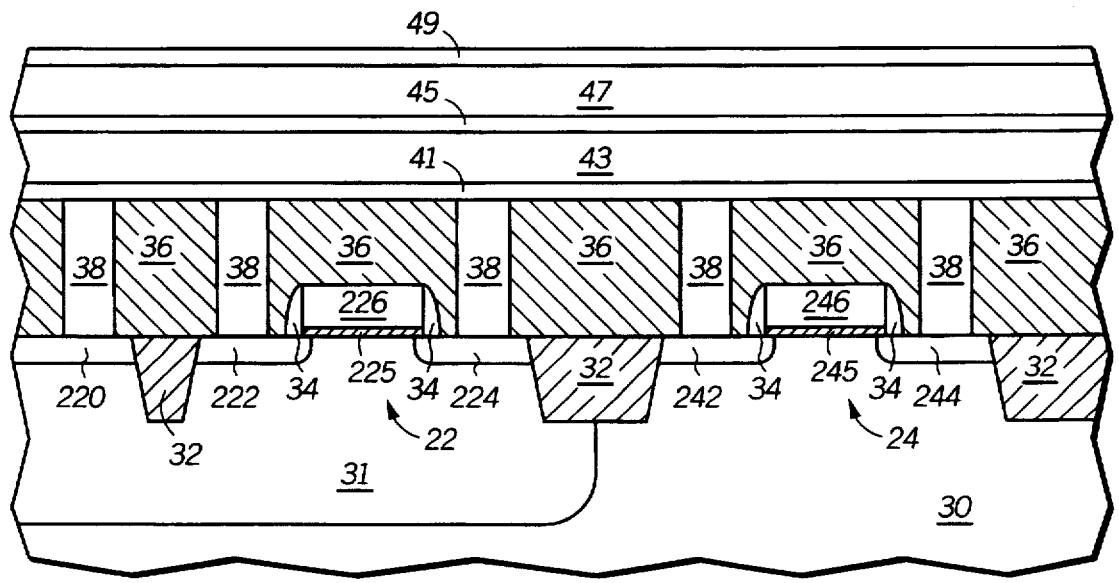
FIG. 4 includes an illustration of a cross-sectional view of, the substrate of FIG. 3 after forming a stack of conductive materials.

A stack of conductive materials is formed over the interlevel insulating layer 36 and contact plugs 38 as shown in FIG. 4. The stack includes a barrier or adhesion layer 41, a first primary layer 43, a conductive stopping layer 45, a second primary layer 47, and an antireflective layer 49. Interconnect portions are subsequently formed from the first primary layer 43, and via portions are subsequently formed from the second primary layer 47.

The adhesion or barrier layer 41 includes titanium, titanium nitride, or the like. The first primary layer 43 includes aluminum, copper, tungsten, other conductive materials, or alloys. The primary metal (metal having the highest concentration) of layer 43 is typically aluminum or copper. Stopping layer 45 is an etch-stop layer and includes a refractory metal, a refractory metal nitride, a silicide, chromium, copper, or platinum. Layer 47 may include any of the materials used for layer 43. If layer 45 is present, layer 47 must be capable of being etched at a faster rate compared to layer 45. If layers 43 and 47 include different materials, the stopping layer 45 may be unnecessary. However, layer 45 may be needed if layers 43 and 47 have the same primary metal. Layer 49 can also be a polish-stop layer. Layer 49 includes titanium nitride, silicon-rich silicon nitride, silicon nitride, aluminum nitride, tungsten, or the like. The layers 41–49 are formed by virtually any deposition method including chemical vapor deposition, sputter deposition, or the like. Each of layers 43 and 47 is at least 2000 angstroms thick, and each of layers 41, 45, and 49 has a thickness less than 1000 angstroms and typically in a range of about 200–600 angstroms.

Figure 5:
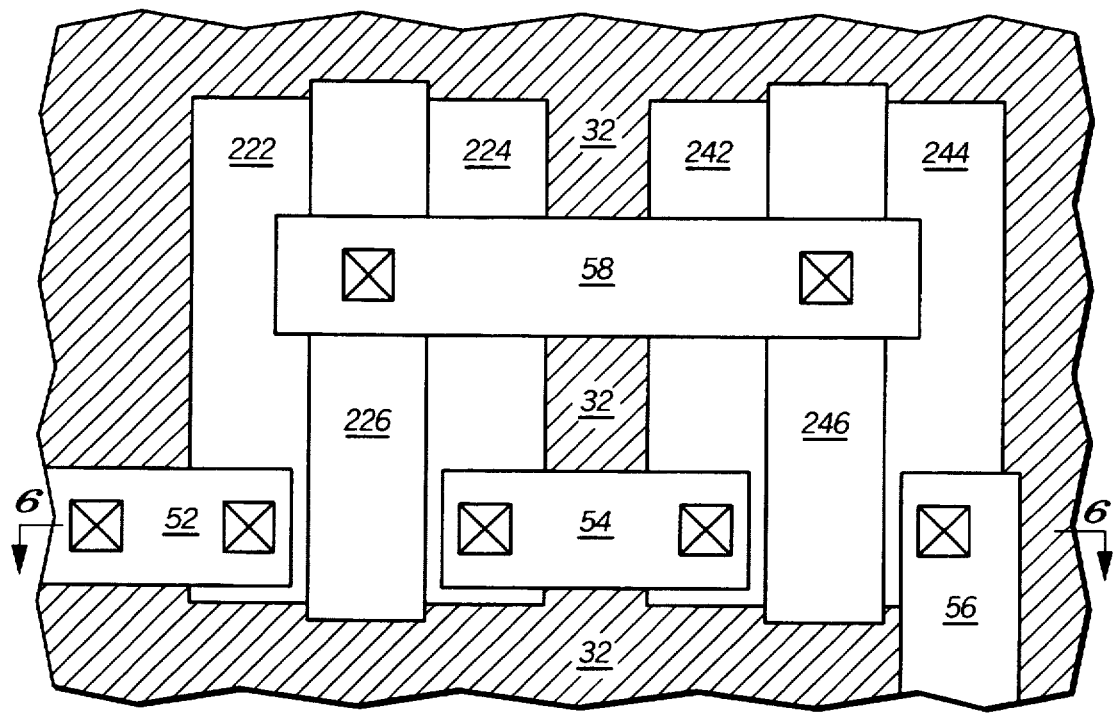
FIGS. 5 and 6 include illustrations of a plan view and a cross-sectional view, respectively, of the substrate of FIG. 4 after patterning the stack for a first time to define interconnect portions.
Figure 6:
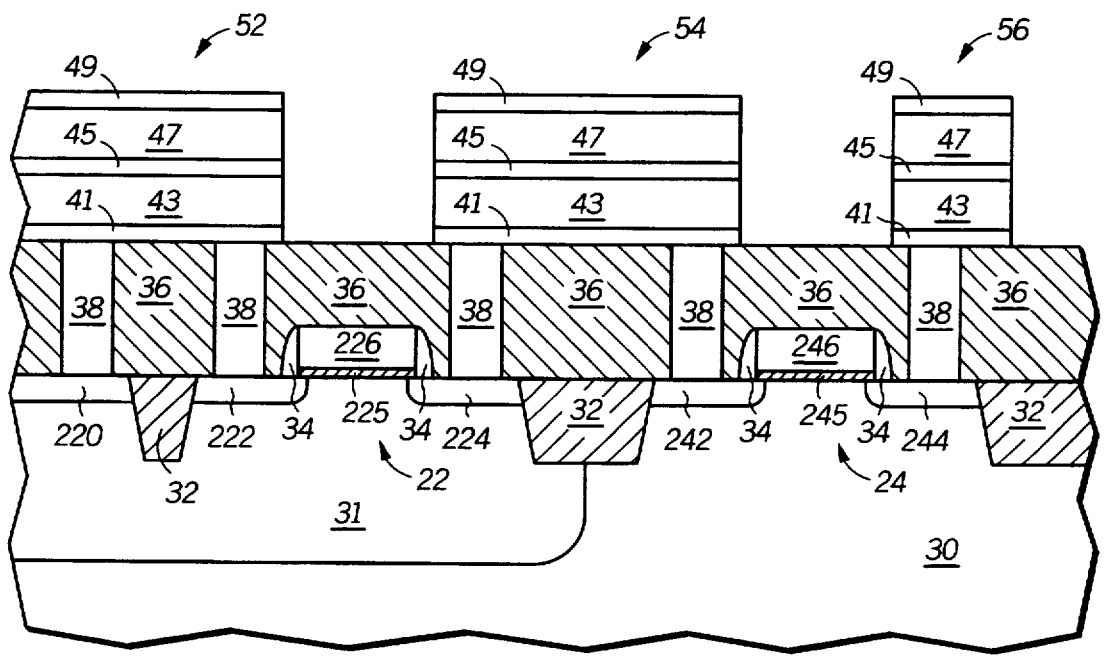

The stack is then patterned to perform conductive members 52, 54, 56 and 58 as shown in FIGS. 5 and 6. FIG. 5 includes is a plan view of the device at this point in the process. The spacers 34 and the interlevel insulating layer 36 are not illustrated in FIG. 5 for simplicity. The inverter has several contacts as shown by ⊠s for several of the conductive members. Member 52 will be coupled to a $V_{DD}$ electrode, and member 56 will be coupled to a $V_{SS}$ electrode. Member 54 is a local interconnect between the drains of two transistors 22 and 24, and member 58 electrically connects the two gate electrodes 226 and 246 to each other. From a plan view, the shapes of the conductive members correspond to the shapes of interconnects.

The patterning is performed by etching all layers in the stack so that sides of member 52, 54, 56, and 58 are substantially coincident with one another as seen in FIG. 6. The etching is performed using one or more steps with various types of different etch chemistries. The actual etch chemistry depends on the materials within the various layers of the members.

Figure 7:
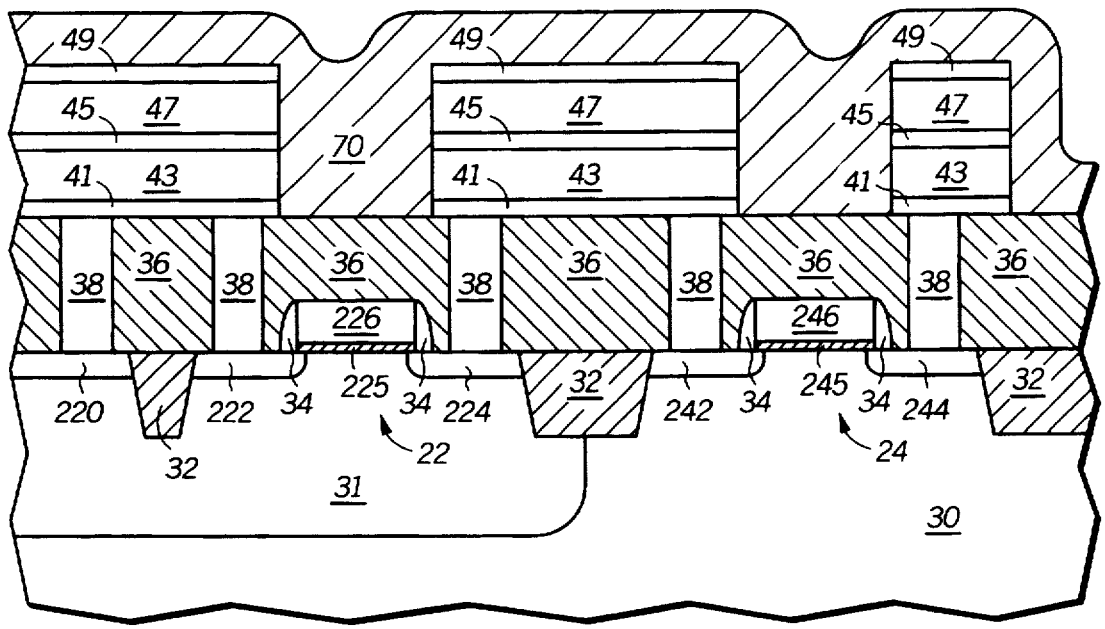
FIG. 7 includes an illustration of a cross-sectional view of the substrate in FIGS. 5 and 6 after forming a lower intermetallic insulating layer over the patterned conductive stacks.

A lower intermetallic insulating layer 70 is formed over the conductive members as shown in FIG. 7. The thickness of the lower intermetallic insulating layer 70 is typically about the same thickness as the combined thickness of the layers 41, 43, and 45. In other embodiments, the thickness of the lower intermetallic insulating layer 70 is in a range of about 25 to 100 percent of the thickness of the conductive members. Typically, the intermetallic layer 70 has a thickness in a range of about 50–75% of the thickness of the conductive members. The thickness may be sufficient to fill in some of the gaps between the conductive members. The lower intermetallic insulating layer 70 includes one or more layers of oxide, nitride, or oxynitride. Layer 70 can be doped or undoped.

Figure 8:
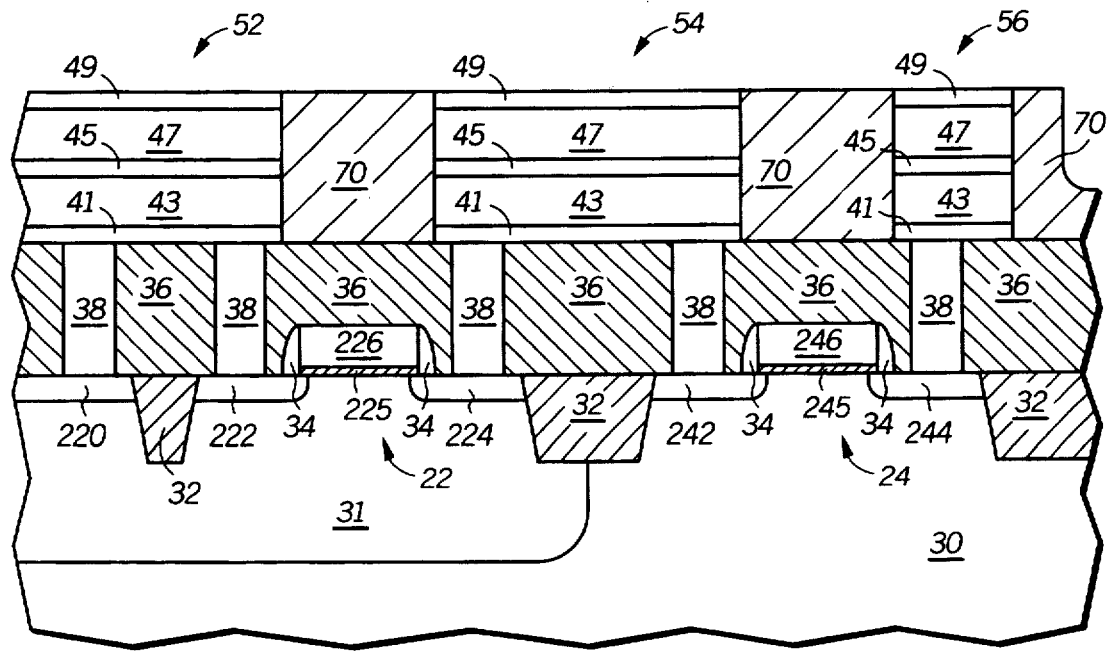
FIG. 8 includes an illustration of a cross-sectional view of the substrate of FIG. 7 after removing a portion of the insulating layer that overlies the patterned conductive stacks.

The device is then polished to remove the lower intermetallic insulating layer 70 from overlying the conductive members as shown in FIG. 8. Likewise, the lower intermetallic insulating layer 70 is also removed from the top of conductive member 58, but is not shown in FIG. 8. Near the conductive members, the lower intermetallic insulating layer 70 is about the same elevation as the conductive members. Further away from the conductive members the thickness of the lower intermetallic insulating layer 70 is less than the thickness of the conductive members.

Figure 9:
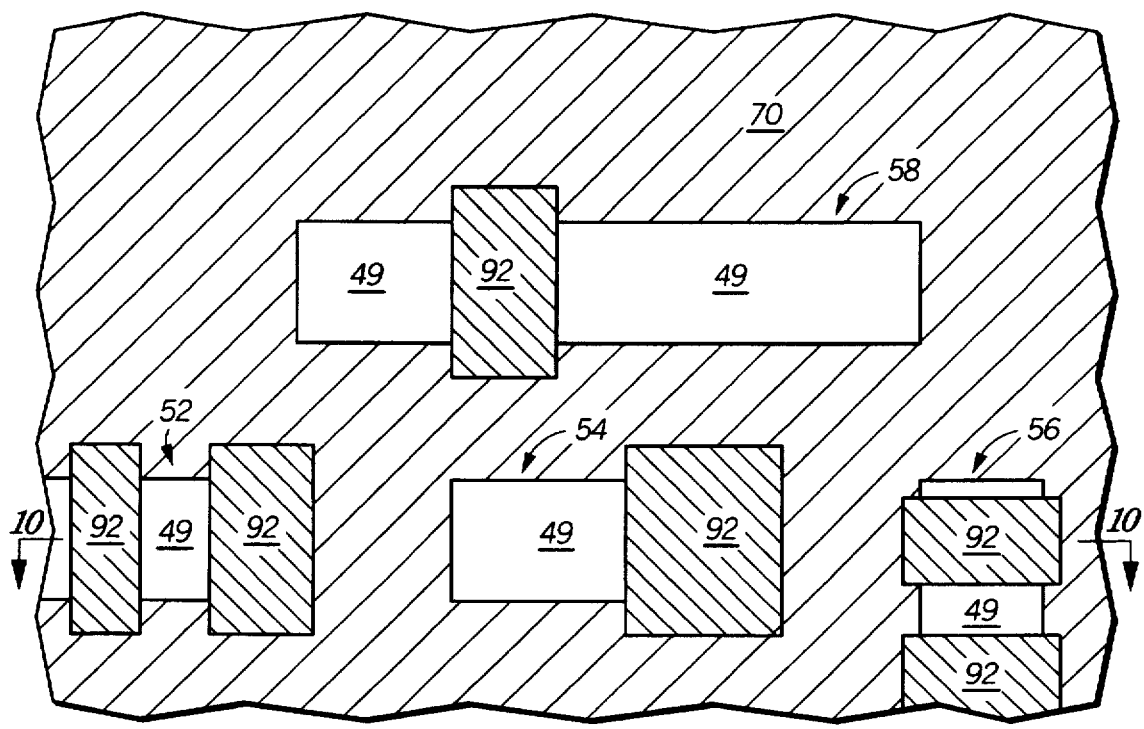
FIGS. 9 and 10 include illustrations of a plan view and a cross-sectional view, respectively, of the substrate of FIG. 8 after forming a resist mask over portions of the substrate.
Figure 10:
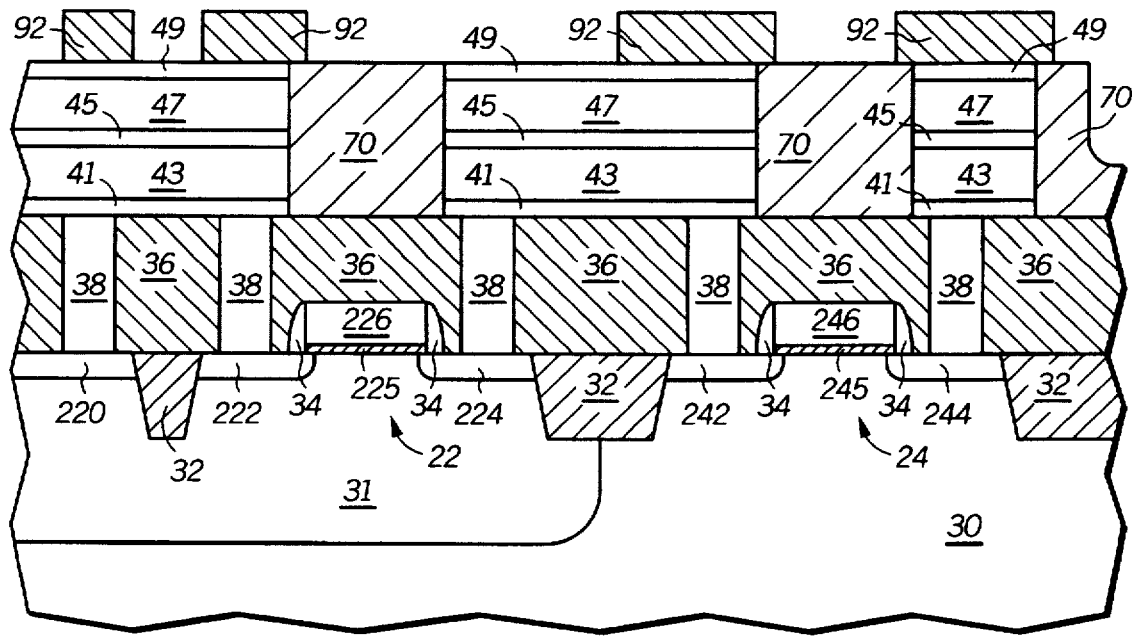

A patterned resist layer 92 is formed over the conductive members 52, 54, 56, and 58 at locations where via portions are to be formed as shown in FIGS. 9 and 10. The via portions are masked portions and will be the via portions that electrically connect layer 43 to an overlying conductive layer. Each of conductive members 54 and 58 is covered by a single portion of resist layer 92. Each of conductive members 52 and 56 is covered by a plurality of portions of the resist layer 92.

The patterned resist layer 92 has portions (resist portions) that are wider than the underlying conductive members 52, 54, 56, and 58 as seen in FIG. 9. As used in this specification, the widths of the resist portions lie along the same direction of the width of the underlying conductive members. In one embodiment, the width of the resist portions is at least as wide as the sum of the misalignment tolerance. For example, if conductive member 58 has a width of 0.50 micron and the misalignment tolerance is ±0.05 micron, the width of the resist portion over the conductive member 58 is at least about 0.60 micron. The significance of the widths of the resist portions is explained in more detail within the benefits section later in this specification. FIG. 10 includes a cross-sectional view of the device at this point in the process. Other masks including a hard mask can be used instead of the patterned resist layer.

Figure 11:
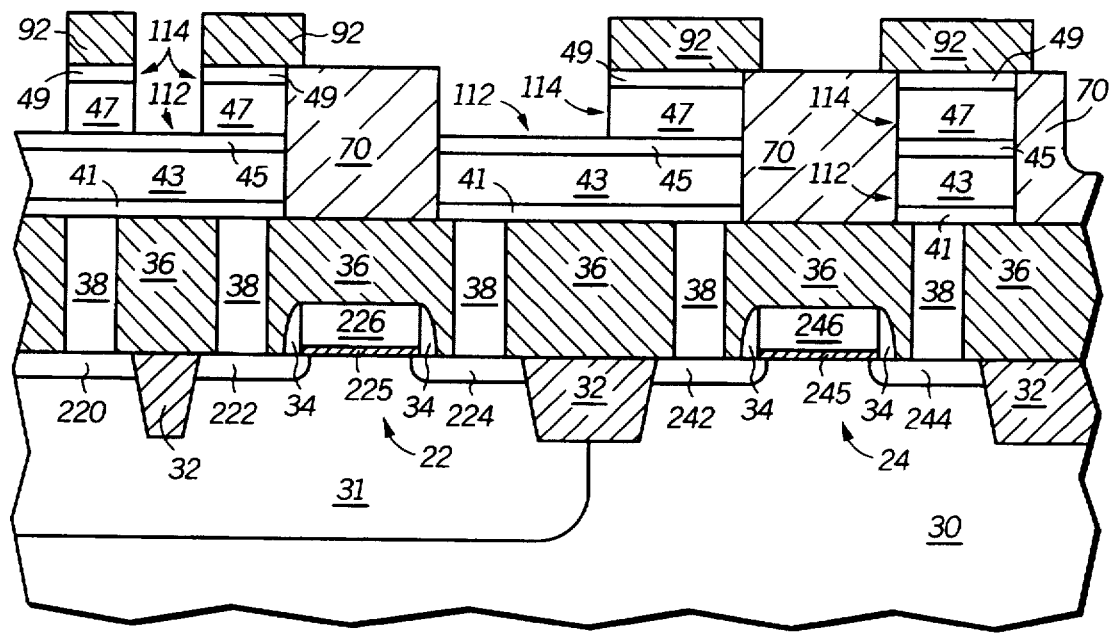
FIG. 11 includes an illustration of a cross-sectional view of the substrate of FIGS. 9 and 10 after patterning the conductive stack to form via portions.
Figure 12:
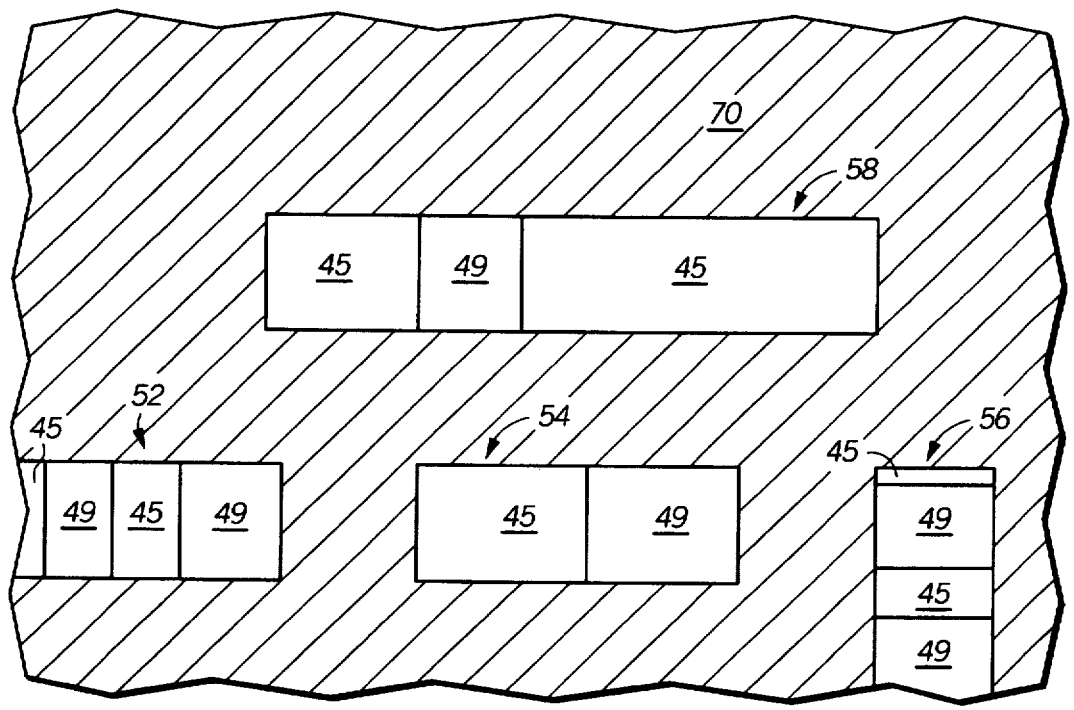
FIG. 12 includes an illustration of a plan view of the substrate of FIG. 11 after removing a resist mask.

Exposed portions of the conductive members 52, 54, 56, and 58 are etched to remove layers 49 and 47 to form interconnect portions 112 and via portions 114 as shown in FIG. 11. The etch is typically performed to stop on or within the stopping layer 45, which etches at a slower rate compared to layer 47. A portion of layer 45 could be removed during the etch step but the thickness should be sufficient and the etch chemistry should be selective enough to prevent the complete removal of the stopping layer 45 of the exposed portions. In this manner, the first level interconnects and vias to a subsequently formed interconnect level have been formed. The patterned resist layer 92 is removed as shown in FIG. 12. The remaining portions of layer 49 are locations where via portions have been formed.

Figure 13:
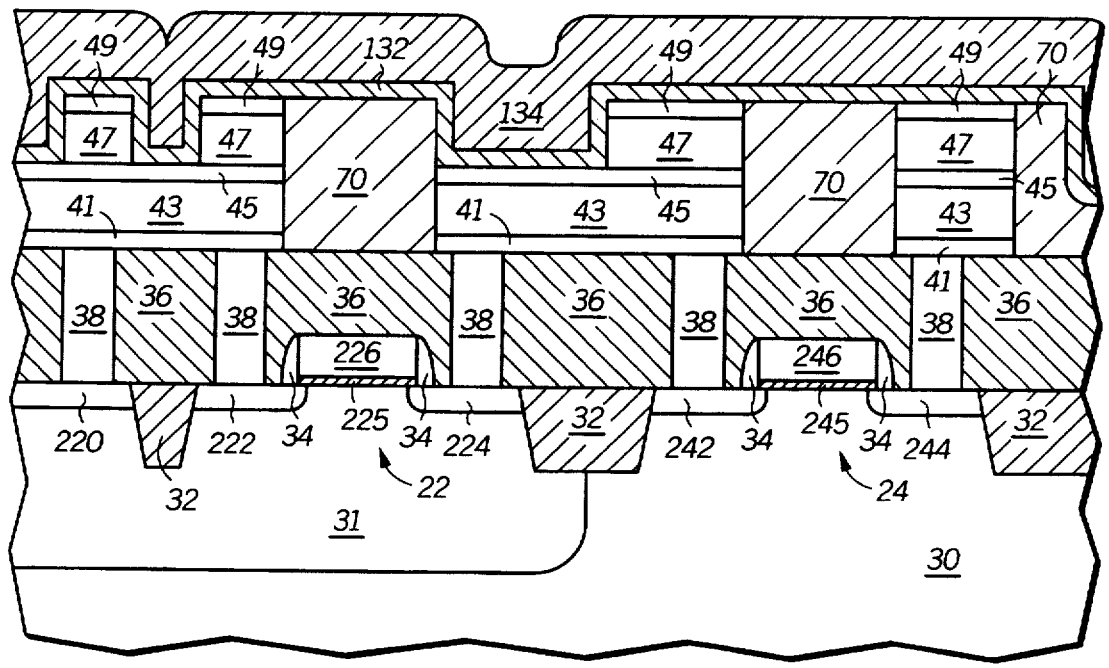
FIG. 13 includes an illustration of a cross-sectional view of the substrate of FIG. 12 after forming an upper intermetallic insulating layer over the twice patterned stacks.

Another stopping layer 132 and an upper intermetallic insulating layer 134 are formed as shown in FIG. 13. In this embodiment, stopping layer 132 is a polish-stop layer and includes a nitride, boron oxynitride, silicon oxynitride, or the like. The upper intermetallic insulating layer 134 includes one or more layers of oxide, nitride, oxynitride, or the like. However, layers 132 and 134 have at least one material that is not common to both. The combined thickness of layers 70, 132, and 134 is as least as thick as the combined thickness of layers 41, 43, 45, and 47. Stopping layer 132 is optional if layer 49 is also a polish-stop layer. However, the presence of stopping layer 132 may be desired to cover portions of the lower intermetallic insulating layer 70 that lie at about the same elevation as the top of the via portions. This helps to reduce the likelihood of dishing in some areas.

Figure 14:
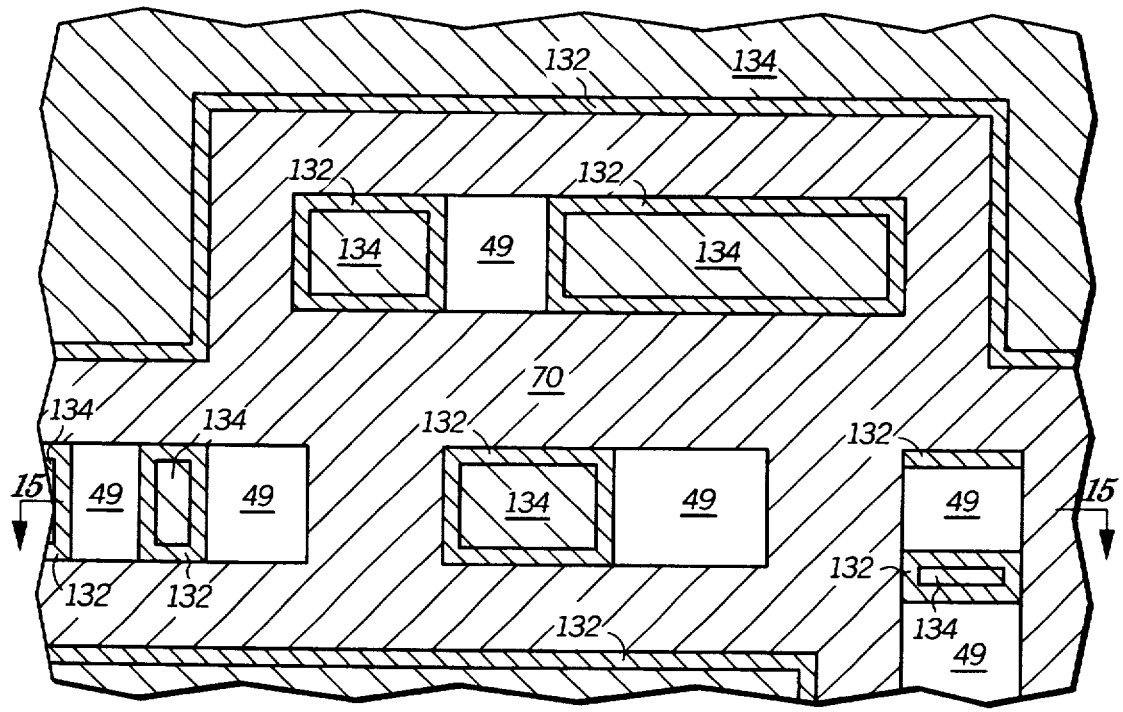
FIGS. 14 and 15 include a plan view and a cross-sectional view, respectively, of the substrate of FIG. 13 after polishing portions of the upper intermetallic insulating layer that overlie the via portions.
Figure 15:
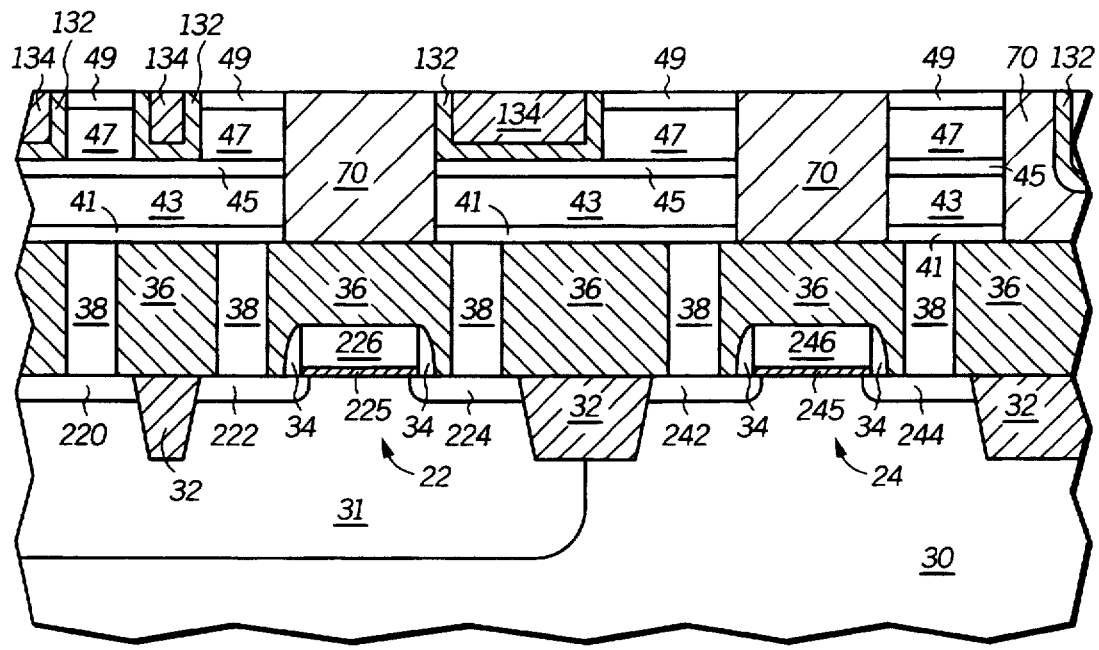

The device is planarized to remove portions of the upper intermetallic insulating layer 134 that overlie the remaining portions of layer 49. The stopping layer 132 polishes at a slower rate compared to the upper intermetallic insulating layer 134. The stopping layer 132 that overlies layer 49 is removed as shown in FIGS. 14 and 15. The planarizing step is typically performed by polishing, although a resist-etch-back process could be used. The stopping layer 132 is typically removed by etching.

In FIG. 14, via portions are formed at locations where layer 49 remains. All other portions of the conductive members are covered by layer 134. FIG. 15 includes a cross-sectional view as shown by the sectioning lines 15—15 in FIG. 14. If layer 49 is relatively conductive, it can remain on the device. However, if layer 49 is too resistive (i.e., an insulator), the remaining portions of layer 49 are removed before forming the next interconnect level. In this particular embodiment only one additional interconnect layer is being formed. Therefore, no further vias need to be formed within the device.

Figure 16:
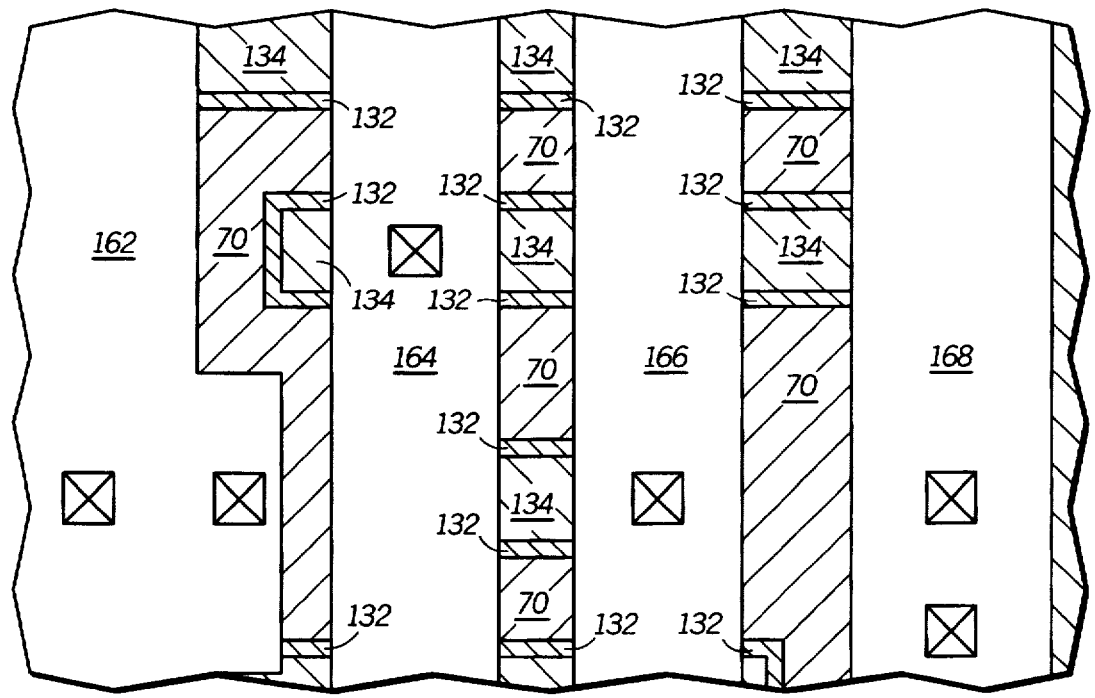
FIG. 16 includes a plan view of the substrate in FIGS. 14 and 15 after forming a second level of interconnects.

The last interconnect level is formed by depositing and patterning a conductive layer to form second level interconnects 162, 164, 166, and 168 as shown in FIG. 16. The via portions of conductive members 52, 54, 56, and 58 that are electrically connected to the interconnects 162, 164, 166, and 168 are illustrated by ⨯s. The interconnects 162, 164, 166, and 168 typically include aluminum, copper, or the like. Other layers including adhesion, barrier, or antireflective layers can be part of the second level interconnects but are not shown for simplicity.

Figure 17:
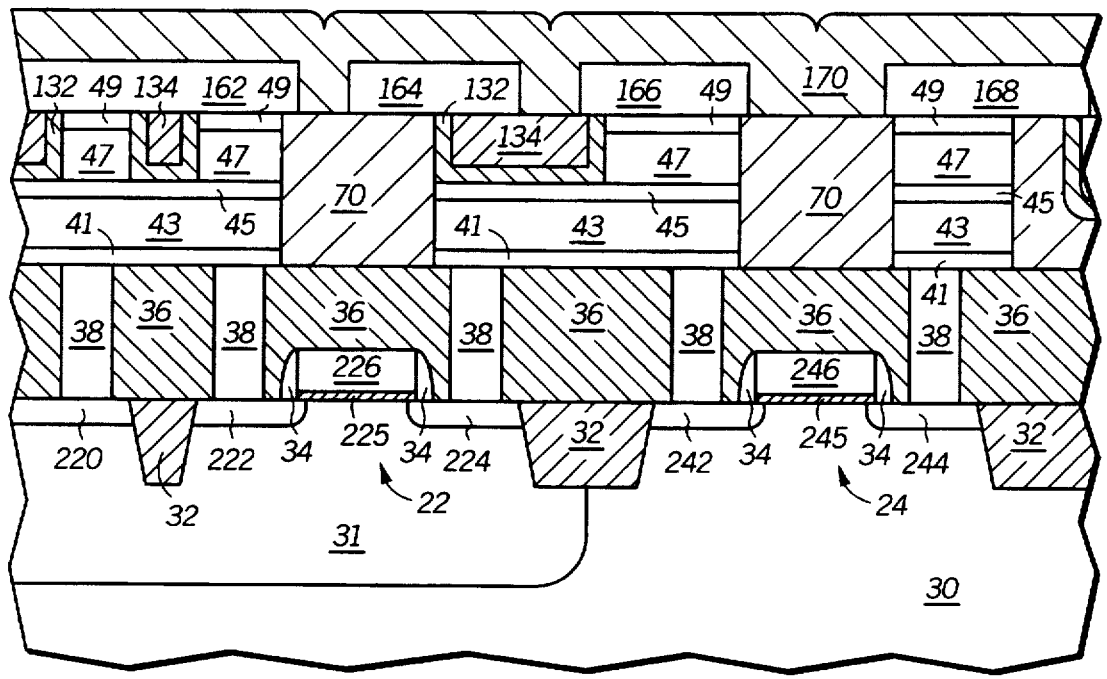
FIG. 17 includes an illustration of a cross-sectional view of the substrate of FIG. 16 after forming a substantially completed device.

FIG. 17 includes a cross-sectional view of the device after forming a passivation layer 170 over the second level interconnects 162–168. At this point in the process, a substantially completed device has been formed.

Figure 18:
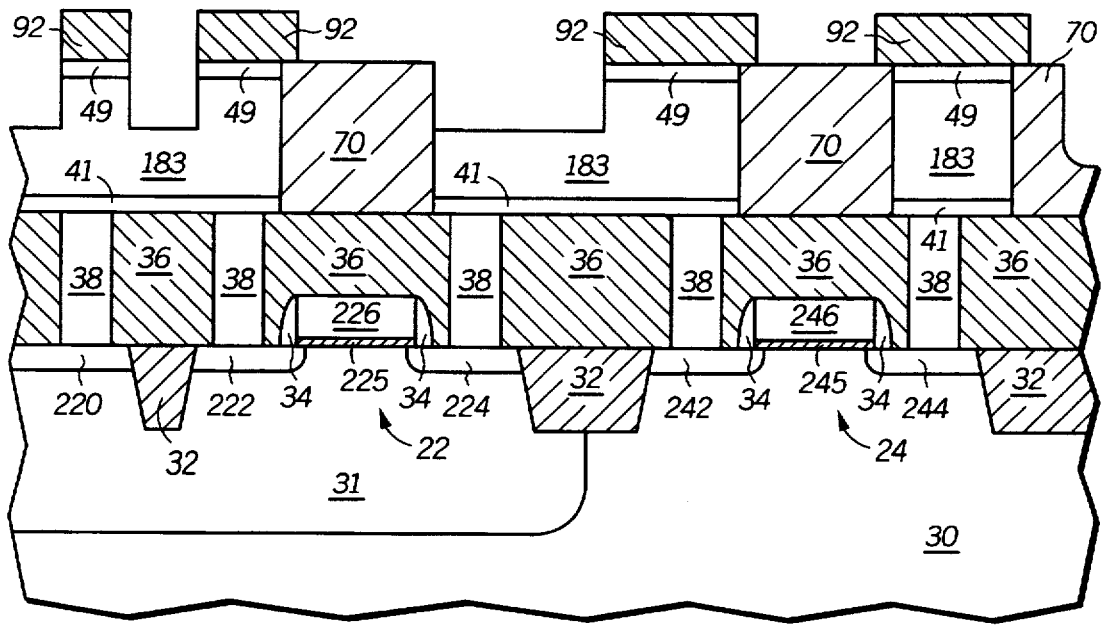
FIG. 18 includes a cross-sectional view of an alternate embodiment after forming via portions.

In an alternate embodiment, the layers 43, 45, and 47 that are part of the conductive members 52, 54, 56, and 58 could be replaced by a single conductive layer 183 as shown in FIG. 18. If layer 183 is etched too thin, a high resistance interconnect or an open electrical open could be formed. If layer 183 is not etched enough, parasitic capacitance or an undesired electrical short can be formed between layer 183 and an overlying interconnect that is not to make electrical contact to layer 183. In this embodiment, a timed etched and good process control may be needed.

Benefits

The embodiments of the present invention planarizes the lower insulating layer adjacent to conductive members before the via portions are formed. The amount of surface area occupied by the interconnect portions is larger than the amount of surface area occupied by the via portions. The lower intermetallic insulating layer is deposited and planarized after the conductive members are formed into the shape of the interconnects. The lower intermetallic insulating layer is not deposited and planarized after the via portions have been formed. If the lower intermetallic insulating layer is polished after the via portions are formed, the via portions and lower intermetallic insulating layer would be thinner than normal causing parasitic capacitance that is too high and possibly electrical shorts. The embodiments of the present invention are less likely to be excessively thinned due to the larger area occupied by the conductive members compared to just the via portions. Therefore, the embodiments of the present invention are less likely to have undesired parasitic capacitance that is too high or electrical shorts.

The embodiments have alignment benefits. Referring to the conductive member 58 in FIG. 9, the 0.60 micron wide resist portion allows the maximum amount of misalignment to occur and still form a via portion with a width that is the same as conductive members 58. The via portions are self aligned to the interconnect portions of the conductive members. Compare this to a conventional process where vias are formed within via openings that are formed within an insulating layer after forming interconnects. In this process, the vias are not self aligned to the interconnects and could be particularly problematic with devices having unlanded vias.

Another advantage of the present invention is not having to form via openings within an insulating layer. Because an oxide layer is not being etched to form via openings, via veils will not be formed.

Still another advantage of the present invention is that it can be easily integrated into an existing process flow. Each of the individual steps of the process can be performed using today's technology. By using the stopping layers, marginal processing steps can be avoided.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor device comprising the steps of:

forming a conductive layer over a semiconductor substrate;

patterning the conductive layer for a first time to remove an entire thickness of the conductive layer;

forming a first insulating layer over the conductive layer after the step of patterning the layer for the first time, wherein the first insulating layer includes a material selected from a group consisting of oxide, nitride, and oxynitride;

removing a portion of the first insulating layer such that a top surface of the conductive layer is exposed;

patterning the conductive layer for a second time to remove only a part of and not the entire thickness of the conductive layer to form an exposed edge of the conductive layer, wherein this step is performed after the step of removing the first insulating layer;

forming a second insulating layer over the first insulating layer and along the exposed edge of the conductive layer, wherein the second insulating layer includes a material selected from a group consisting of oxide, nitride, and oxynitride and wherein, this step is performed after the step of patterning the conductive layer for a second time; and polishing the second insulating layer to remove all of a portion of the second insulating layer that overlies the top surface of the conductive layer.

2. The process of claim 1, wherein the step of forming the conductive layer comprises steps of:

depositing a first metallic layer; and depositing a second metallic layer.

3. The process of claim 2, wherein each of the first and second metallic layers comprises a material selected from a group consisting of aluminum and copper and is at least 2000 angstroms thick.

4. The process of claim 1, further comprising a step of forming a masking layer before the step of patterning the conductive layer for a second time, wherein the masking layer overlies a masked portion of the conductive layer and leaves an exposed portion of the conductive layer.

5. The process of claim 1, wherein:

the process further comprises a step of forming a stopping layer over the conductive layer before the step of forming the second insulating layer; and the step of polishing the second insulating layer is performed to stop before removing all of the stopping layer over any portion of the conductive layer.

6. The process of claim 5, wherein the stopping layer comprises a material selected from a group consisting of a nitride, boron oxynitride, and silicon oxynitride.

7. A process for forming a semiconductor device comprising the steps of:

forming a first insulating layer over a semiconductor substrate;

forming a first conductive layer over the first insulating layer;

forming a second conductive layer over the first conductive layer;

patterning the first and second conductive layers to remove entire thicknesses of the first and second conductive layers to form a first conductive member and a second conductive member, wherein each of the first and second conductive members includes the first and second conductive layers;

forming a second insulating layer over and between the first and second conductive members, wherein the second insulating layer includes a material selected from a group consisting of oxide, nitride, and oxynitride;

removing a portion the second insulating layer such that a top surface of the first and second conductive members become exposed, wherein another portion of the second insulating layer remains between the first and second conductive members;

forming a masking layer over the second conductive layer of the first and second conductive members to form exposed portions of the second conductive layer;

patterning the conductive member to remove an entire thickness of the exposed portions of the second conductive layer without removing all of the first conductive layer that underlies the exposed portions of the second conductive layer to form an exposed edge of the second conductive layer, wherein this step is performed after the step of removing the second insulating layer;

forming a third insulating layer over the second insulating layer and along the exposed edge of the second conductive layer, wherein the third insulating layer includes a material selected from a group consisting of oxide, nitride, and oxynitride and wherein, this step is performed after the step of patterning the conductive member; and polishing the third insulating layer to remove all of a portion of the third insulating layer that overlies the top surface of the second conductive layer.

8. The process of claim 7, wherein:

the steps of forming the first and second conductive layers are performed such that the first and second conductive layers have a same primary metal; and the process further comprises a step of forming a stopping layer between the steps of forming the first and second conductive layers.

9. The process of claim 7, wherein the steps of forming the first and second conductive layers are performed such that the first and second conductive layers have different primary metals.

10. The process of claim 8, wherein the step of removing a portion of the second insulating layer is performed such that the top surface of the second conductive layer lies at about a same elevation as a portion of the second insulating layer adjacent to the second conductive layer.

11. The process of claim 7, wherein:

the process further comprises a step of forming a stopping layer over the second conductive layer after the step of removing a portion of the second insulating layer; and the step of polishing the third insulating layer is performed to stop before removing all of the stopping layer that overlies the second conductive layer.

12. The process of claim 11, wherein the stopping layer polishes at a slower rate compared to the third insulating layer during the step of polishing.

13. The process of claim 11, wherein the third insulating layer includes an oxide and the stopping layer includes a material selected from a group consisting of a nitride, boron oxynitride, and silicon oxynitride.

14. A process for forming a semiconductor device comprising the steps of:

forming a first insulating layer over a semiconductor substrate;

forming a first conductive layer at least 2000 angstroms thick over the first insulating layer;

forming a first stopping layer over the first conductive layer;

forming a second conductive layer at least 2000 angstroms thick over the first stopping layer;

patterning the first conductive, first stopping, and second conductive layers to remove entire thicknesses of the first conductive, first stopping, and second conductive layers to form a conductive member, wherein sides of the first conductive, first stopping, and second conductive layers are substantially coincident with one another;

forming a second insulating layer over the conductive member, wherein the second insulating layer includes a material selected from a group consisting of oxide, nitride, and oxynitride;

removing a portion the second insulating layer such that a top surface of the conductive member becomes exposed;

forming a masking layer over the conductive member thereby leaving exposed portions of the second conductive layer;

patterning the conductive member to remove the exposed portions of the second conductive layer without removing any of the first conductive layer that underlies the exposed portions of the second conductive layer to form an exposed edge of the second conductive layer;

forming a third insulating layer over the second insulating layer and along the exposed edge of the second conductive layer, wherein the third insulating layer includes a material selected from a group consisting of oxide, nitride, and oxynitride and wherein, this step is performed after the step of patterning the conductive member; and polishing the third insulating layer to remove all of a portion of the third insulating layer that overlies the top surface of the second conductive layer.

15. The process of claim 14, wherein the steps of forming the first and second conductive layers are performed such that the first and second conductive layers have a same primary metal.

16. The process of claim 14, wherein the steps of forming the first and second conductive layers are performed such that the first and second conductive layers have different primary metals.

17. The process of claim 14, wherein:

the step forming the first stopping layer is performed such that the first stopping layer is conductive; and the step of patterning the conductive member is performed by etching, wherein the first stopping layer etches at a slower rate compared to the second conductive layer.

18. The process of claim 14, wherein the first stopping layer includes a material selected from a group consisting of a refractory metal, a refractory metal nitride, a silicide, chromium, copper, and platinum.

19. The process of claim 14, wherein:

the process further comprises a step of forming second stopping layer over the second conductive layer after the step of removing a portion of the second insulating layer; and the step of planarizing is performed by polishing and stops before removing all of the second stopping layer that overlies the second conductive layer.

20. The process of claim 19, wherein the second stopping layer polishes at a slower rate compared to the third insulating layer during the step of planarizing.

21. The process of claim 19, wherein the third insulating layer includes an oxide and the second stopping layer includes a material selected from a group consisting of a nitride, boron oxynitride, and silicon oxynitride.

* * * * *

UNITED STATES PATENT AND TRADEMARK OFFICE
CERTIFICATE OF CORRECTION

PATENT NO. : 5,593,919
DATED : January 14, 1997
INVENTOR(S) : Chii-Chang Lee and Hisao Kawasaki It is certified that error appears in the above-indentified patent and that said Letters Patent is hereby corrected as shown below:

Column 8, line 39, after "portion", insert --of--.

Signed and Sealed this

Ninth Day of September, 1997

Attest:

BRUCE LEHMAN

Attesting Officer

Commissioner of Patents and Trademarks